US011127710B2

(12) United States Patent
Benaissa et al.

(10) Patent No.: US 11,127,710 B2
(45) Date of Patent: Sep. 21, 2021

(54) METHOD FOR TRANSFERRING STRUCTURES

(71) Applicant: COMMISSARIAT A L'ENERGIE ATOMIQUE ET AUX ENERGIES ALTERNATIVES, Paris (FR)

(72) Inventors: Lamine Benaissa, Grenoble (FR); Ismail Degirmencioglu, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 71 days.

(21) Appl. No.: 16/503,662

(22) Filed: Jul. 5, 2019

(65) Prior Publication Data

US 2020/0020663 A1    Jan. 16, 2020

(30) Foreign Application Priority Data

Jul. 10, 2018    (FR) ...................................... 18 56356

(51) Int. Cl.
*H01L 23/00* (2006.01)
*H01L 25/00* (2006.01)

(52) U.S. Cl.
CPC .............. *H01L 24/83* (2013.01); *H01L 25/50* (2013.01)

(58) Field of Classification Search
CPC . H01L 21/6835; H01L 21/6836; H01L 24/83; H01L 24/95; H01L 25/0753; H01L 2221/68322; H01L 2221/68368; H01L 2224/83; H01L 2224/95; H01L 2224/95001
See application file for complete search history.

(56) References Cited

U.S. PATENT DOCUMENTS

| | | | | |
|---|---|---|---|---|
| 6,961,993 | B2* | 11/2005 | Oohata | H05K 3/32 29/832 |
| 2016/0043254 | A1* | 2/2016 | Krause | H01L 21/6835 136/244 |
| 2016/0111604 | A1* | 4/2016 | Li | H01L 24/95 257/91 |

OTHER PUBLICATIONS

French Preliminary Search Report dated May 22, 2019 in French Application 18 56356, filed on Jul. 10, 2018 (with English Translation of Categories of Cited Documents).
Na, J. et al. "Programming Reversibly Self-Folding Origami with Micropatterned Photo-Crosslinkable Polymer Trilayers", Advanced Materials 27, 2015, pp. 79-85.
Tachi, T. "Freeform Origami Tessellations by Generalizing Resch's Patterns", Proceedings of the ASME 2013 International Design Engineering Technical Conference and Computers and Information in Engineering Conference IDETC/CIE, 2013, pp. 1-10.

(Continued)

*Primary Examiner* — David C Spalla
(74) *Attorney, Agent, or Firm* — Oblon, McClelland, Maier & Neustadt, L.L.P.

(57) ABSTRACT

A transfer method includes steps of a) supplying a support layer having a first face, structures being assembled by their front face on the first face, and c) transferring the structures onto a host face of a host substrate. The support layer includes folding regions, between the structures, adapted to pass from a folded state to an unfolded state under the action of an external excitation. Between steps a) and c), a step b) is included of executing the external action in such a way as to make the folding regions pass from the folded state to the unfolded state such that the spacing between the structures varies.

26 Claims, 11 Drawing Sheets

(56) References Cited

OTHER PUBLICATIONS

Ionov, L. "Soft Microorigami: self-folding polymer films", Soft Matter, 2011, pp. 6786-6791.
U.S. Appl. No. 14/893,396, filed Nov. 23, 2015, 2016/0126215 A1, Bruno Imbert, et al.
U.S. Appl. No. 15/028,836, filed Apr. 12, 2016, 2016/0257597 A1, Lamine Benaissa, et al.
U.S. Appl. No. 16/003,199, filed Jun. 8, 2018, 2018/0358381 A1, Yann Lamy, et al.
U.S. Appl. No. 16/221,939, filed Dec. 17, 2018, 2019/0198397 A1, Francois Andrieu, et al.

* cited by examiner

METHOD FOR TRANSFERRING STRUCTURES

TECHNICAL FIELD

The present invention relates to a method for transferring structures onto a host face of a host substrate. Notably, the present invention implements a support layer provided with foldable and unfoldable regions making it possible to vary the spacing between the structures.

PRIOR ART

Figure 1A:
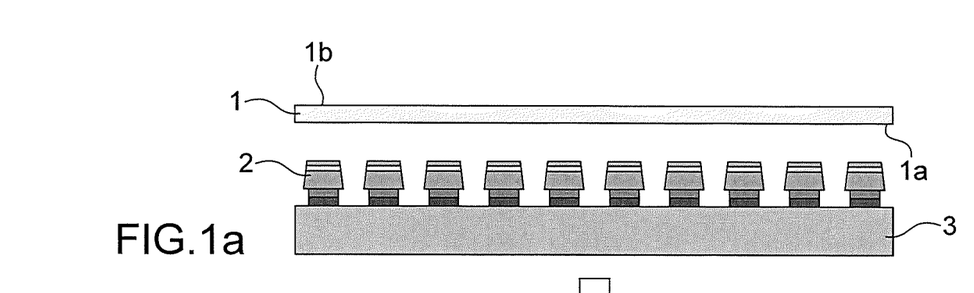
FIGS. 1a to 1c are schematic representations of a transfer method involving a stretchable substrate known from the prior art.
Figure 1B:
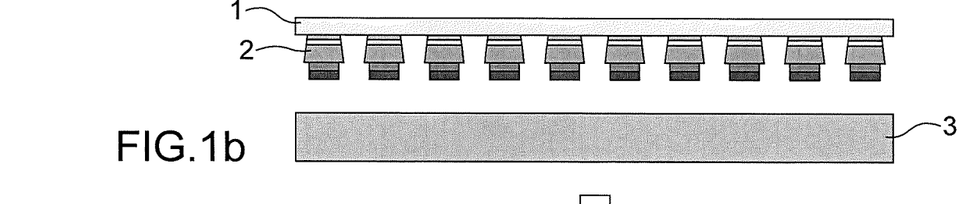
Figure 1C:
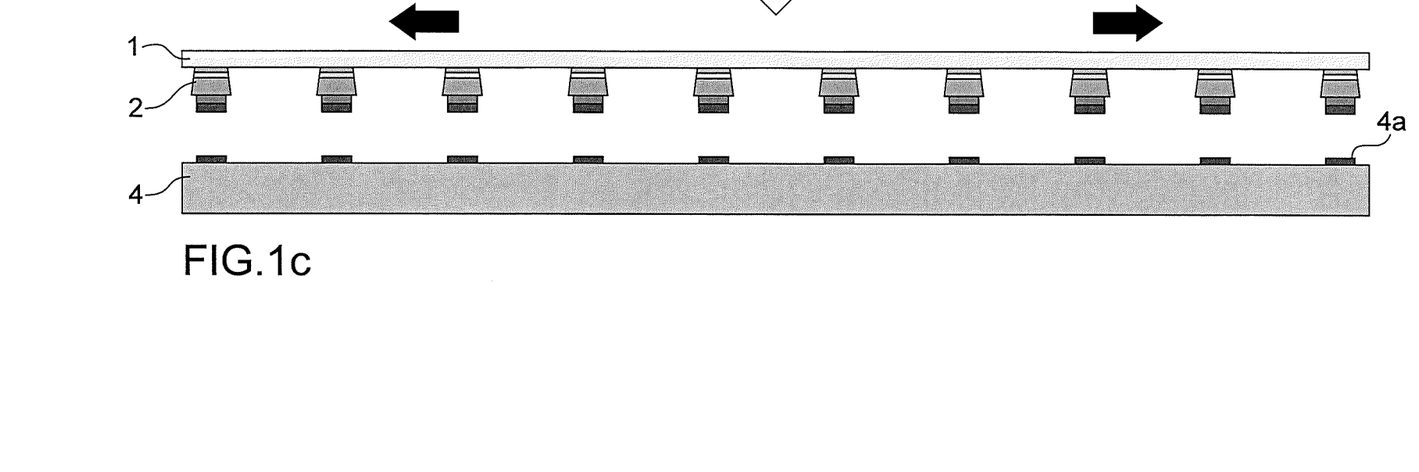

A method for transferring structures known from the prior art is described in the document [1] cited at the end of the description and illustrated in FIGS. 1a to 1c.

The method known from the prior art notably comprises the following successive steps:

a) the supply of a temporary substrate 1 comprising two main faces, essentially parallel, called respectively first 1a and second 1b face, the temporary substrate 1 being stretchable, a plurality of structures 2 being assembled along one of their faces, called front face, on the first face;

b) the stretching of the temporary substrate 1 along at least one direction in such a way as to increase the spacing along the at least one direction between the structures, c) a step for transferring the plurality of structures onto a host face 4a of a final substrate 4.

Step a) is generally preceded by a step of removal of the plurality of structures that rest by one of their faces, opposite to the front face, called rear face, on a face, called initial face, of an initial substrate 3.

In particular, the removal step (FIG. 1a) may comprise the assembly of the first face 1a of the temporary substrate with the front face of each of the structures, followed by the detachment of said structures from the initial face (FIG. 1b).

In this respect, the adhesion between the rear face and the initial face is generally adjusted to facilitate the removal step.

Notably, the adhesion between the rear face and the initial face may have an energy less than the adhesion energy of the structures on the first face of the temporary substrate, such that the detachment is performed selectively between the initial face of the initial substrate and the rear face of the structures.

The temporary substrate proposed in [1] is a stretchable substrate. In other words, the temporary substrate is made of a material of which the Young's modulus is sufficiently low to stretch said temporary substrate along at least one direction, called stretching direction. The material, according to [1], may notably comprise a flexible polymer material, and in particular an elastomer.

"Elastomer" is taken to mean a polymer that has elastic properties and is capable, under the effect of a traction or a stretching, of having a high deformation before rupture. More specifically, the measurement of the elasticity of a material is quantified by its Young's modulus, and a material will be considered as stretchable from the moment that its Young's modulus is less than 0.1 GPa.

Step b) of the method known from the prior art comprises the application of a traction force to the temporary substrate along at least one direction, comprised in the plane formed by the first face, in such a way as to stretch said substrate (FIG. 1c). This stretching results in an increase in the spacing between the structures before their transfer onto the host face of the host substrate.

This method is then implemented from the moment that it involves transferring structures according to a different layout or spacing between said structures from one substrate to the other, thereby overcoming the problems of costs and cycle time associated with the transfer of structures by individual placement (Pick and Place).

However, this method of massive transfer of structures is not satisfactory either.

Indeed, the stretching, at step b), of the temporary substrate is not uniform. Notably the contact zones between the structures and the temporary face are not subjected to the same stretching amplitude as the remainder of the temporary substrate.

This non-uniformity of stretching affects, and notably reduces, the adhesion of the structures on the temporary face. The stretching amplitude is thus limited so as to guarantee the adhesion of the structures on the temporary surface.

Furthermore, the stretching also imposes a stress at the level of the structures, and may thereby cause a deformation of the latter.

Moreover, the efficiency of the removal of the structures on the initial substrate is, in part, governed by the adhesion energy of the structures to the material forming the temporary substrate, and a removal selectivity cannot be ensured by all stretchable materials.

Finally, the stretching only enables homothetic rearrangements of the structures, thereby offering very little flexibility in terms of rearrangement of the structures during the transfer step.

One aim of the present invention is thus to propose a method for collectively transferring structures via a support layer enabling variations in spacings between the structures much greater than those known from the prior art.

Another aim of the present invention is to propose a method for bulk transfer of structures via a support layer offering more degrees of freedom in terms of repositioning of the structures than methods known from the prior art.

DESCRIPTION OF THE INVENTION

The aims of the present invention are, at least in part, attained by a method for transferring structures onto a host substrate, the method comprising the following successive steps:

a) supplying a support layer comprising two main faces called, respectively, first face and second face, structures, each comprising a front face and a rear face, being assembled by their front face on the first face;

c) a step for transferring the structures onto a host face of a host substrate, the method being remarkable in that the support layer comprises folding regions, between the structures, adapted to pass, in a reversible manner, from a folded state to an unfolded state under the action of an external excitation, the method further comprises, between steps a) and c), a step b) of executing the external action in such a way as to make the folding regions pass from one or the other of the folded or unfolded states to the other of the folded or unfolded states such that the spacing between the relative positions of the structures with respect to one another varies before the execution of step c).

According to an embodiment, the support layer comprises an intermediate layer adapted, under the action of the external excitation, to vary its stress state, and thereby generate the passage from one or the other of the folded and unfolded states to the other of these two states.

According to an embodiment, the support layer comprises from its first face to its second face, a first layer, the intermediate layer, and a second layer, the first layer and the second layer, having, respectively, first trenches and second trenches at the level of which are inscribed folds at the level of the folding regions when the support layer is in the folded state.

According to an embodiment, during the passage from an unfolded state to a folded state, the change of stress state of the intermediate layer corresponds to a swelling of said layer such that the first trenches and the second trenches define on the first face, in the folded state, respectively, edge folds and hollow folds.

According to an embodiment, during the passage from an unfolded state to a folded state, the change of stress state of the intermediate layer corresponds to a contraction of said layer such that the first trenches and the second trenches define on the first face, in the folded state, respectively, hollow folds and edge folds.

According to an embodiment, the first layer and the second layer each have a Young's modulus greater than that of the intermediate layer, advantageously the Young's modulus of the first layer and of the second layer is greater than 2 GPa, even more advantageously equal to 4 GPa.

According to an embodiment, the first layer and the second layer comprise poly(p-methylstyrene).

According to an embodiment, the external excitation is a variation in pH.

According to an embodiment, the intermediate layer comprises at least one of the elements selected from: poly(4-vinyl pyridine)-polystyrene, poly(2-hydroxyethyl methacrylate)-poly(methacrylic acid), poly(methacrylic acid)-polyethylene glycol, poly(N-isopropylacrylamide-co-acrylic acid)-polyethylene glycol), gold-poly(methacryl oxyethyl trimethylammonium chloride).

According to an embodiment, the external excitation comprises the addition of a solvent, notably water or methanol.

According to an embodiment, the intermediate layer comprises at least one of the elements selected from: polyvinyl alcohol-chitosan, chitosan polyethylene glycol, polydimethylsiloxane-polyurethane/2-hydroxyethyl methacrylate, gold-poly(glycidyl methacrylate).

According to an embodiment, the external excitation comprises a variation in temperature, notably a rise in temperature.

According to an embodiment, the intermediate layer comprises at least one of the elements selected from: gold-polydimethylsiloxane, SU8-polycaprolactone resin, poly(N-isopropylacrylamide)-polycaprolactone, polycaprolactone, poly(caprolactone-co-pentadecadolactone).

According to an embodiment, the external excitation comprises an electric pulse, the intermediate layer advantageously comprising polydimethylsiloxane-cardiomyocytes or gold-poly pyrrole.

According to an embodiment, the external excitation comprises the implementation of an enzyme, the intermediate layer advantageously comprising metal-gelatine-carboxymethylcellulose.

According to an embodiment, the support layer rests by its second face on a support substrate, the adhesion energy between the second face and the support substrate being adjusted in order to enable the passage from one or the other of the folded and unfolded states to the other of these two states, advantageously, the adhesion energy is less than 0.5 $J/m^2$, even more advantageously less than 0.3 $J/m^2$.

According to an embodiment, a layer, called relaxation layer, is intercalated between the support layer and the support substrate, advantageously the relaxation layer comprises a polyacrylic acid.

According to an embodiment, step a) is preceded by a step of removal a1) of the structures arranged along their rear face, on one face, called initial face, of an initial substrate.

According to an embodiment, the step of removal a1) successively comprises:
 an assembly of the front face of the structures with the first face of the support layer,
 a detachment, called first detachment, of the structures from the initial substrate.

According to an embodiment, the first detachment requires an energy, called first detachment energy, adjusted to be less than the adhesion energy between the front face of the structures and the first face.

According to an embodiment, the first detachment energy is less than 0.5 $J/m^2$.

According to an embodiment, the adjustment of the first detachment energy comprises a step of weakening the interface between the initial face and the rear face, advantageously, the weakening step comprises a reduction in the contact surface between the initial face and the rear face.

According to an embodiment, step c) successively comprises:
 an assembly of the structures with the host substrate by placing in contact said structures by their rear face with the host face of the host substrate,
 a detachment, called second detachment, of the structures from the first face in such a way as to transfer said structures onto the host face.

According to an embodiment, the adhesion energy of the structures on the first face is less than the adhesion energy of the structures on the host face.

According to an embodiment, the host substrate comprises on its host face sites, called host sites, onto which are transferred the structures, the host sites being adapted to favour the adhesion of the structures on said host sites compared to the adhesion of said structure on the first face.

According to an embodiment, the host sites comprise at least one of the elements selected from: solder balls, micro tubes, metal stacks enabling adhesion of the structures on the host face by eutectic bonding, magnetic materials, a polymer adhesive.

The invention also relates to a method for transferring structures of a first type, of a second type and of a third type onto a host substrate, the method successively comprising the transfer, according to the present invention, of structures of the first type, of the second type and of the third type onto the host substrate According to an embodiment, the structures of the first type, of the second type and of the third type are LEDs each emitting in a different wavelength domain.

BRIEF DESCRIPTION OF THE DRAWINGS

Other characteristics and advantages will become clear from the description that follows of a transfer method according to the invention, given as non-limiting examples, with reference to the appended drawings in which.

DETAILED DESCRIPTION OF PARTICULAR EMBODIMENTS

The present invention relates to a method for transferring structures onto a face, called host face, of a host substrate.

In particular, the transfer step implements a support layer having regions that can be folded and unfolded, advantageously in a reversible manner, making it possible to vary the spacing of the structures with their transfer onto the host substrate.

According to the terms of the present invention, the folding and the unfolding of the support layer is executed via the action of an external excitation. In particular, the external excitation enables a change of stress state of the support layer thereby generating the folding and unfolding processes in the folding regions.

FIGS. 2a-2b, 3a-3d, 4a-4f, 5, and 6a-6b illustrate, schematically, the different steps of the method for transferring structures according to the present invention.

Figure 2A:
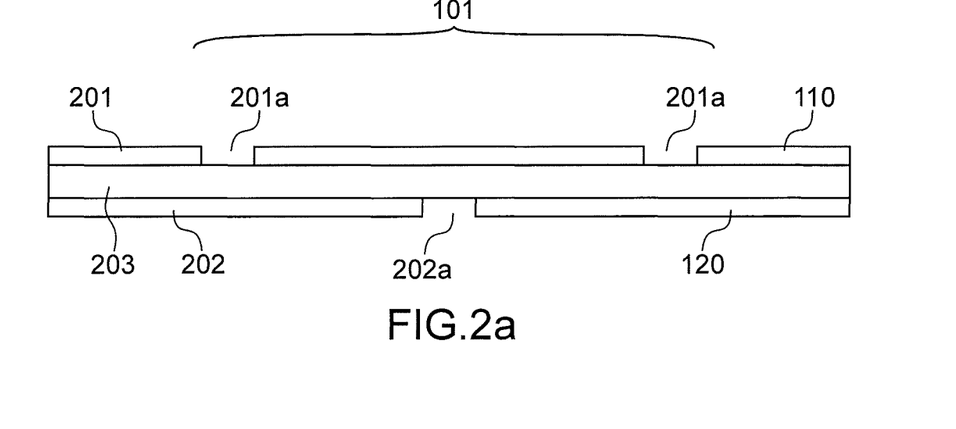
FIGS. 2a and 2b are schematic representations, along a sectional plane of the support layer, perpendicular to the first face, of the transition from an unfolded state (FIG. 2a) to a folded state (FIG. 2b) of a folding region according to the present invention.
Figure 4A:
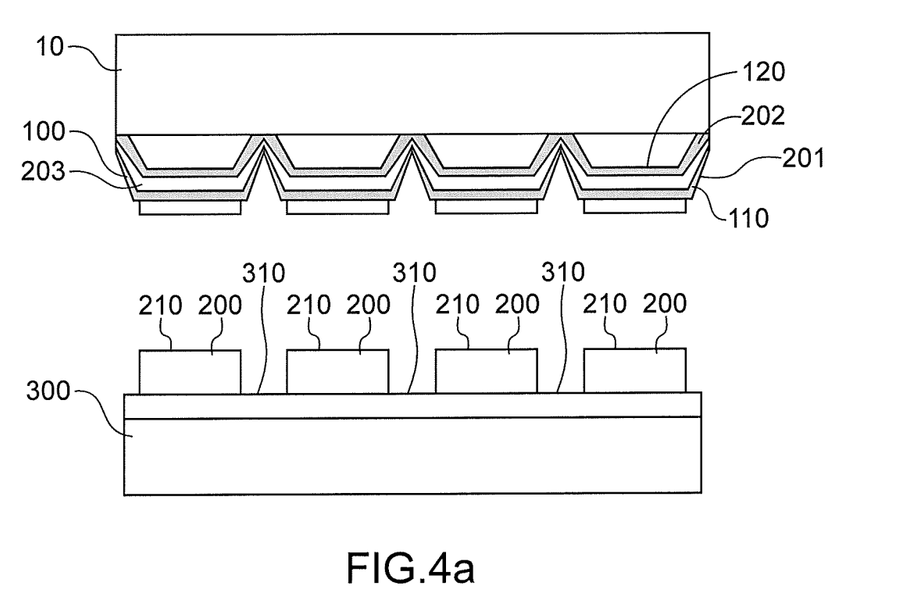
FIGS. 4a to 4f are schematic representations, along a sectional plane of the support layer, perpendicular to the first face, of the method for transferring structures onto a host substrate according to the present invention.

In particular, the method according to the present invention comprises a step a) of supplying a support layer 100 which comprises two main faces, essentially parallel, called, respectively, first face 110 and second face 120 (FIGS. 2a and 4a).

Figure 4B:
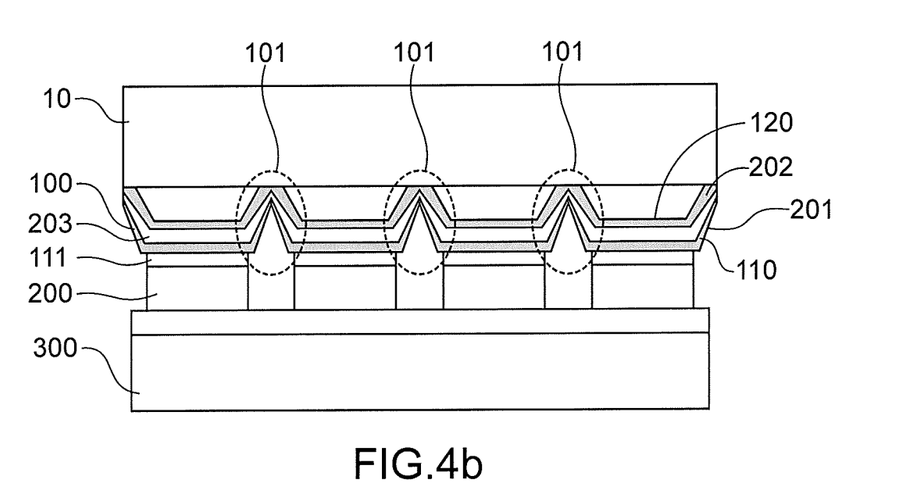
Figure 4C:
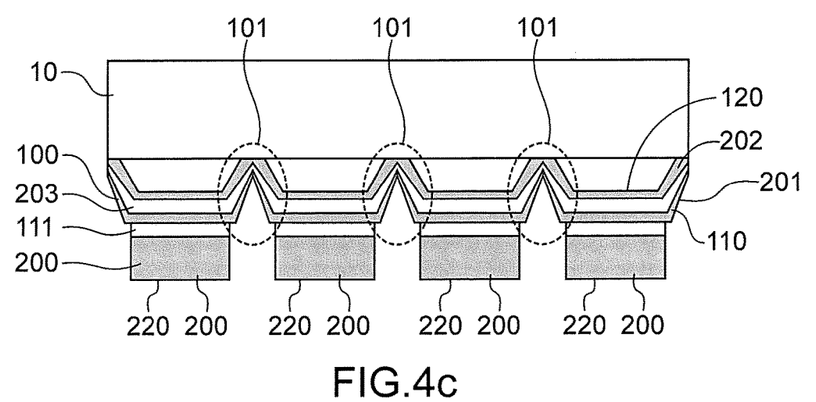

Structures 200, each comprising a front face 210 and a rear face 220, are assembled, along their front face 210, on the first face 110 of the support layer 100 (FIG. 4c).

"Assembled" is taken to mean that the structures are maintained to the support layer by adhesion of their front face on the first face of said support layer.

In particular, the contact between the front face 210 and the first face 110 forms an interface called temporary contact interface 111 (FIG. 4c).

The support layer 100 comprises folding regions 101, between the structures, adapted to pass, in a reversible manner, from a folded state to an unfolded state under the action of an external excitation.

In this respect the folding regions 101 may be formed by first paths and second paths different from the first paths, for example perpendicular to the first paths.

The folding regions 101 may take different types of shapes. Notably, the folding regions 101 may represent a grid pattern, regular or not. In an alternative or complementary manner, the folding regions 101 may be, at least in part, curved. The document [3] cited at the end of the description lists different types of folding regions capable of being implemented within the scope of the present invention.

"Folded state" is taken to mean a region that has hollow folds and ridge folds.

The passage from a folded state to an unfolded state then makes it possible to vary the spacing between the structures 200.

The passage from the folded state to the unfolded state is induced by the action of an external excitation.

In a particularly advantageous manner, the passage from the folded state to the unfolded state is reversible.

Figure 2B:
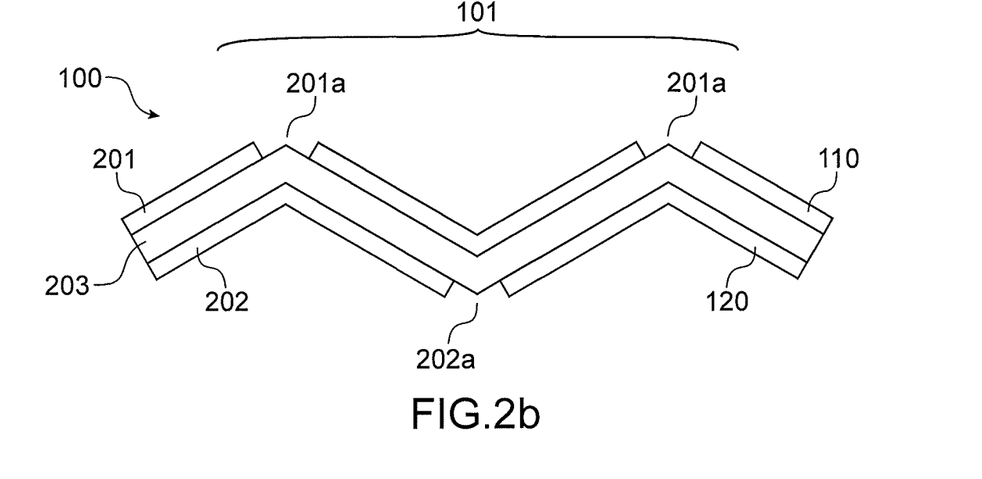

The support layer 100 may comprise an intermediate layer 203 adapted, under the action of the external excitation, to vary its stress state, and thereby generate the passage from one or the other of the folded and unfolded states to the other of these two states. In particular, the support layer 100 may comprise from its first face 210 to its second face 220, a first layer 201, the intermediate layer 203, and a second layer 202. Notably, the first layer 201 and the second layer 202, having, respectively, first trenches 201a and second trenches 202b at the level of which are inscribed folds in the folding regions 101 when the support layer 100 is in the folded state (FIG. 2b).

Those skilled in the art will be able to adjust the widths of the first and second trenches, as well as the thicknesses of the first layer 201, of the second layer 202 and of the intermediate layer 203 as a function of the required folding angles.

In particular, the widths of the first trenches 201a and of the second trenches 202a may be comprised between 200 nm and 30 μm.

The first layer 201 and the second layer 202 may have a thickness comprised between 0.07 μm and 1 μm.

The intermediate layer 203 may have a thickness comprised between 1 μm and 6 μm.

According to a first configuration, the passage from an unfolded state to a folded state may correspond to a change of stress state of the intermediate layer associated with a swelling of said layer.

"Swelling" is taken to mean an expansion of the intermediate layer 203. The swelling, in the sense of the present invention, may comprise not just the establishment of a tensile stress but also the absorption of a liquid or of a gas.

Thus, FIGS. 2a and 2b illustrate the passage from an unfolded state to a folded state of the support layer 100 under the action of an external excitation.

The action of the external excitation on the intermediate layer 203 causes the swelling of the latter, notably at the very spot of the first trenches 201a and the second trenches 202a. The expansion of the intermediate layer 203 at the level of the first and second trenches 201a and 202a induces the formation, on the first face, of ridge folds and hollow folds defined, respectively, by the first trenches 201a and by the second trenches 202a.

The return to the unfolded state may then be executed according to a reverse process, namely the contraction of the intermediate layer.

According to a second configuration, the passage from an unfolded state to a folded state may correspond to a change of stress state of the intermediate layer 203 associated with a contraction of said layer.

"Contraction" is taken to mean a reduction in the volume of the intermediate layer 203.

The action of the external excitation on the intermediate layer 203 causes the contraction of the latter, notably at the very spot of the first trenches 201a and of the second trenches 202a. The contraction of the intermediate layer 203 at the level of the first and second trenches 201a and 202a induces the formation, on the first face, of hollow folds and ridge folds defined, respectively, by the first trenches 201a and by the second trenches 202a.

Whatever the considered configuration, the first layer 201 and the second layer 202 each have a Young's modulus greater than that of the intermediate layer, in such a way as to stiffen the support layer 100.

Advantageously, the Young's modulus of the first layer 201 and of the second layer 202 is greater than 2 GPa, even more advantageously equal to 4 GPa.

As an example, the first layer 201 and the second layer 202 may each comprise poly(p-methylstyrene) (hereafter "PpMS").

The PpMS is advantageously implemented with benzophenone acting as photo-initiator.

The first trenches 201a and the second trenches 202b, in the specific case of PpMS, may be formed by a photolithography step. However, the present invention is not limited to the formation of trenches by photolithography, and any other technique, known to those skilled in the art, and capable of being suitable for the formation of trenches, may be implemented within the scope of the present invention.

Concerning the external excitation, the latter may take different forms. In particular, and in a non-limiting manner, the external excitation may comprise:
 a variation in pH;
 the addition of a solvent, notably water or methanol;
 a variation in temperature, notably a rise in temperature;
 an electric pulse;
 the implementation of an enzyme.

If the external excitation comprises a variation in pH, the intermediate layer 203 may advantageously comprise at least one of the elements selected from: poly(4-vinyl pyridine)-polystyrene, poly(2-hydroxyethyl methacrylate)-poly(methacrylic acid), poly(methacrylic acid)-polyethylene glycol, poly(N-isopropylacrylamide-co-acrylic acid)-polyethylene glycol, gold-poly(methacryl oxyethyl trimethylammonium chloride).

If the external excitation comprises an addition of solvent, the intermediate layer 203 may advantageously comprise at least one of the elements selected from: polyvinyl alcohol-chitosan, chitosan polyethylene glycol, polydimethylsiloxane-polyurethane/2-hydroxyethyl methacrylate, gold-poly(glycidyl methacrylate).

If the external excitation comprises a variation in temperature, the intermediate layer 203 may advantageously comprise at least one of the elements selected from: gold-polydimethylsiloxane, SU8-polycaprolactone resin, poly(N-isopropylacrylamide)-polycaprolactone, polycaprolactone, poly(caprolactone-co-pentadecadolactone).

If the external excitation comprises an electric pulse, the intermediate layer may advantageously comprise polydimethylsiloxane-cardiomyocytes or gold-poly pyrrole.

If the external excitation comprises the implementation of an enzyme, the intermediate layer 203 may advantageously comprise metal-gelatine-carboxymethylcellulose.

In a particularly advantageous manner, the support layer 100 rests by its second face 120 on a support substrate 10. In particular, the adhesion energy between the second face 120 and the support substrate 10 is adjusted in order to enable the passage from one or the other of the folded and unfolded states to the other of these two states, advantageously, the adhesion energy is less than 0.3 J/m². In other words, the adhesion energy between the support layer 100 and the support substrate is adjusted to confer on said support layer the faculty of folding and unfolding. This function, or adjustment of the adhesion energy, may be assured by a layer, called relaxation layer 400, intercalated between the support layer 100 and the support substrate 10.

Advantageously, the relaxation layer 400 comprises polyacrylic acid (hereafter "PAA").

A layer of PAA may have a thickness comprised between 500 nm and 5 μm.

A particular exemplary embodiment of the support layer 100 on a support substrate 10 is illustrated in FIGS. 3a to 3d.

Figure 3A:
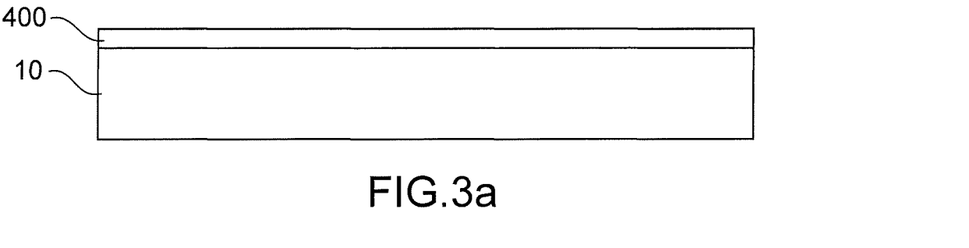
FIGS. 3a to 3d are schematic representations, along a sectional plane of the support layer, perpendicular to the first face, of the different steps capable of being implemented for the formation of the support layer according to the present invention.
Figure 3B:
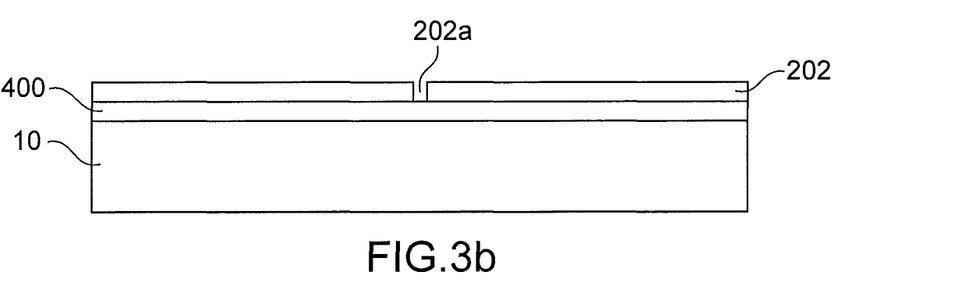
Figure 3C:
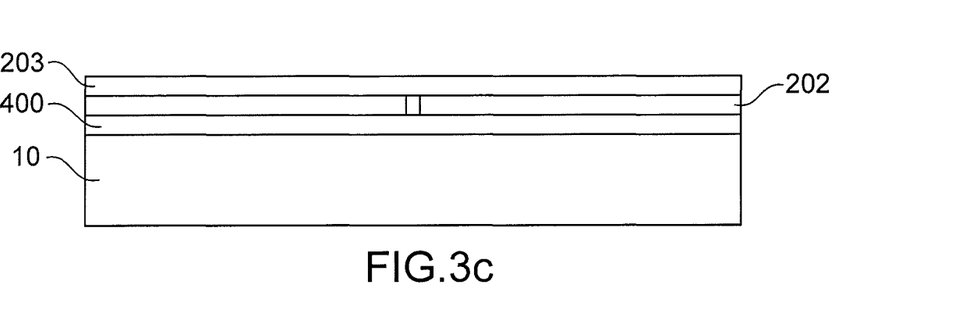
Figure 3D:
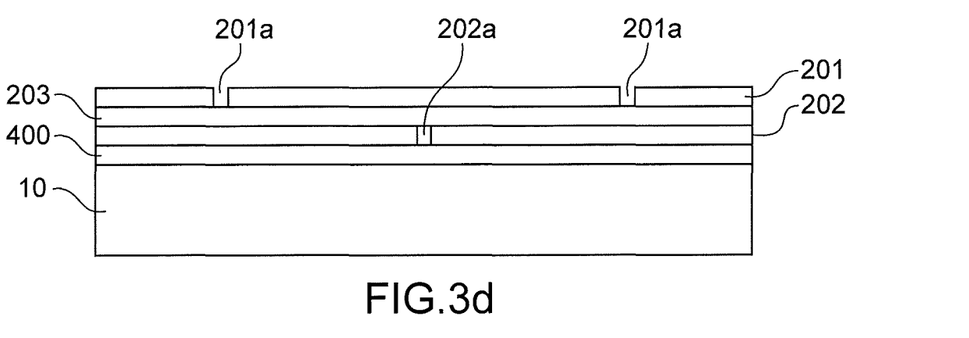

This particular example comprises the supply of a support substrate 10, for example a substrate made of a semiconductor material, notably silicon.

A relaxation layer 400 is then formed on a main face of the support substrate 10. For example, the relaxation layer 400 comprises PAA with a thickness of 2 μm (FIG. 3a).

The formation of the second layer 202 (FIG. 3b) on the layer of PAA is executed by spreading PpMS by spin coating. The PpMS moreover contains a photo-initiator, for example benzophenone, and is diluted in toluene according to a concentration by weight comprised between 10 mg/mL to 100 mg/mL, for example 50 mg/mL. The second layer 202 may have a thickness comprised between 0.07 μm and 5 μm, for example 0.5 μm.

The formation of the second layer 202 is then followed by the formation of the second trenches 202a (FIG. 3c), for example by a photolithography step, and more specifically by UV photolithography, at a wavelength of 365 nm.

An intermediate layer 203, comprising poly(N-isopropyl acrylamide-co-sodium acrylate) (hereafter "PNIPAM"), is next formed on the second layer 202. The PNIPAM is firstly spread out on the second layer 202 by spin coating, and, secondly, cross-linked with a dose of UV radiation of the order of 10 J/cm². The intermediate layer of PNIPAM may have a thickness comprised between 1 μm and 15 μm or between 2 μm and 6 μm depending on the solvents and types of drying implemented.

Finally, the first layer 201 (FIG. 3d), with its first trenches 201a, is formed on the intermediate layer 203 according to the same modalities as the second layer 202.

Concerning the structures 200, the latter may, during a step a1) preceding step a), have been removed, along their rear face 220, from an initial face 310 of an initial substrate 300 (FIGS. 4a to 4c).

In particular, the removal step a1) may successively comprise:
 1a1) an assembly of the front face 210 of each of the structures 200 on the first face 110 (FIGS. 4a and 4b),
 2a1) a detachment, called first detachment, of the structures from the initial substrate 300 (FIG. 4c).

Step 1a1) may comprise a step of direct bonding by placing the first face 110 in contact with the front faces 210.

The structures may be laid out in a matrix fashion on the initial face, without however limiting the present invention to this layout.

"Laid out in a matrix fashion" is taken to mean a regular and periodical arrangement of structures along the directions X and Y different from each other and comprised in a plane defined by the face on which said structures rest.

It is understood that the removal step a1) does not modify this matrix layout of the structures.

It is also understood that during the removal step, the structures 200 are placed in contact with the first face between the folding regions.

Step 2a1), of first detachment, may require an energy, called first detachment energy, adjusted to be less than the adhesion energy between the front face 210 of the structures 200 and the first face 110, called temporary adhesion energy. Thus, this hierarchisation of the adhesion energies makes it possible to remove efficiently all of the structures 200.

The first adhesion energy may, for example, be adjusted by an appropriate choice of the material forming the initial face.

In an alternative or complementary manner, the first adhesion energy may also be adjusted by weakening the interface between the initial face 310 of the initial substrate 300 and the rear face 220 of the structures 200.

This weakening step may for example comprise a reduction in the contact surface between the rear face 220 of the structures 200 and the initial face 310 of the initial substrate 300.

Figure 5:
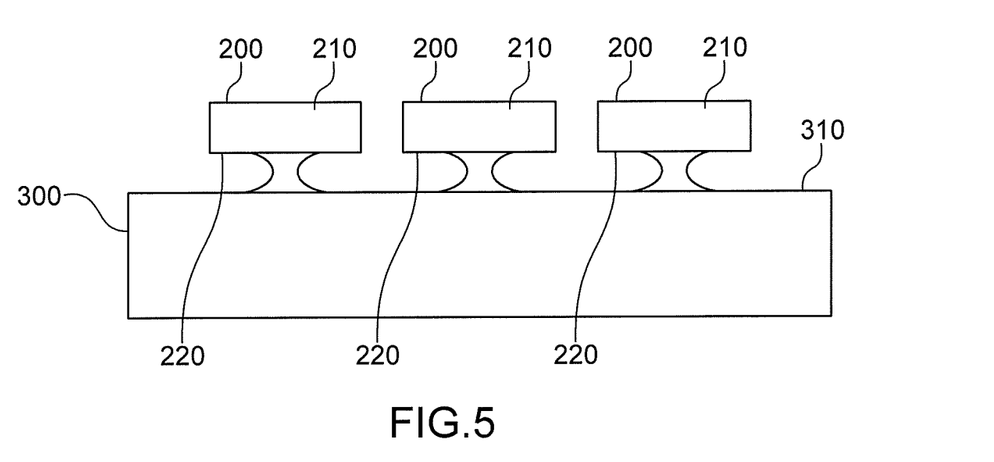
FIG. 5 is a schematic representation of a step of weakening the interface between the structures and the initial face, implemented for the first detachment.

The reduction in surface may be obtained by an etching step, notably by liquid process, at the level of the interface formed by the rear face 220 and the initial face 310. Notably, the etching step may comprise a partial removal of the material forming the initial face 310 in contact with the rear face 220 (FIG. 5).

The adjustment of the first detachment energy may then be carried out such that the latter is less than 0.3 $J/m^2$.

In a complementary manner, the temporary adhesion energy is advantageously greater than 0.5 $J/m^2$.

Figure 4D:
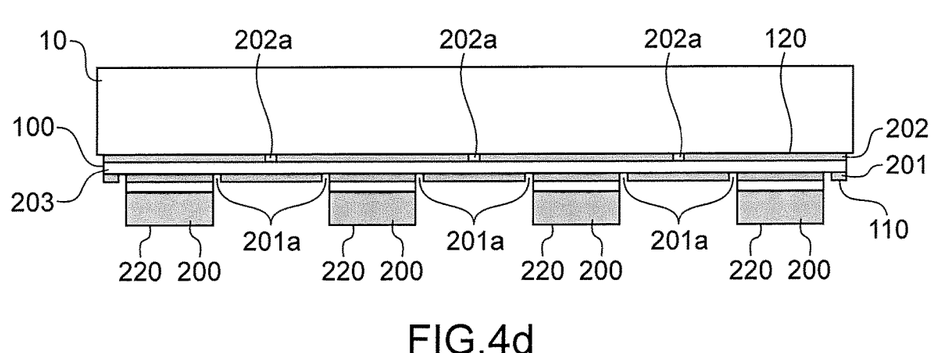
Figure 4E:
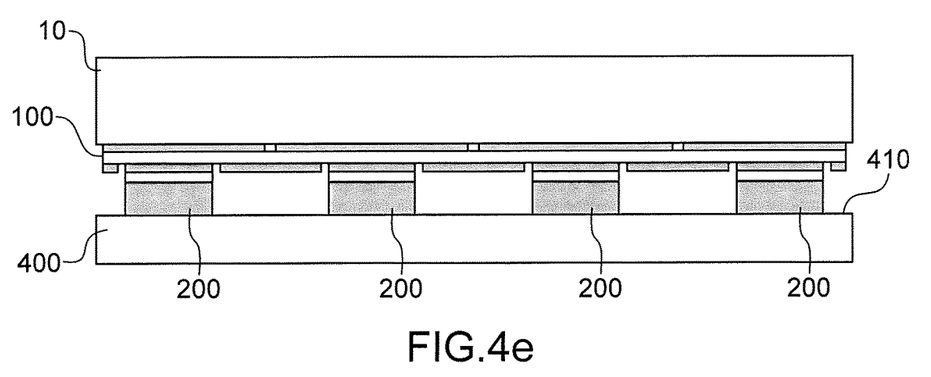

Step a) may then be followed by a step b) which comprises the application of an external action (stimulus) in such a way as to make the folding regions pass from one or the other of the folded or unfolded states to the other of the folded or unfolded states such that the spacing between the structures varies (FIG. 4d).

For example, at the end of step a), the support layer 100 may have folding regions 101 in a folded state. In other words, step b) comprises the application of a stimulus to unfold said folding regions 101.

According to this example, the spacing between the structures 200 increases during the execution of step b).

It is understood that the spacing between the structures, and potentially the relative layout of said structures, varies as a function of the orientation of the first trenches 201a and of the second trenches 202a.

Figure 6A:
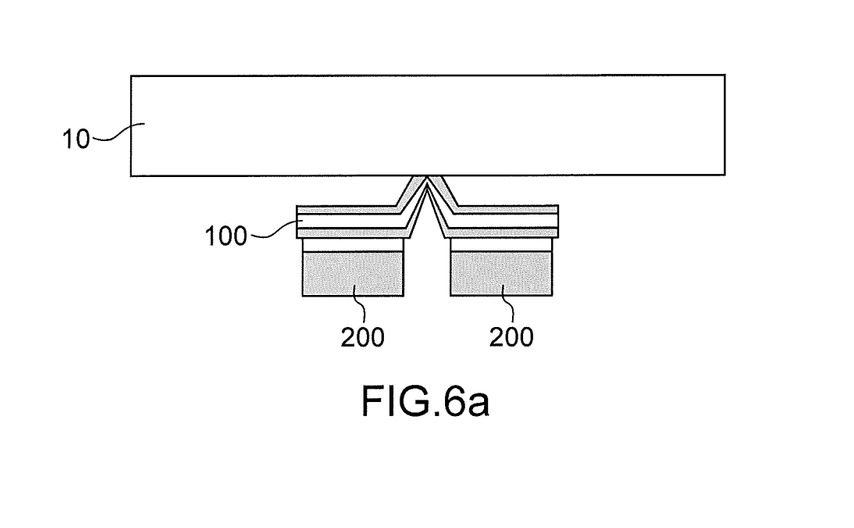
FIGS. 6a and 6b are schematic representations, along a sectional plane of the support layer, perpendicular to the first face, of the mechanism of unfolding the support layer.
Figure 6B:
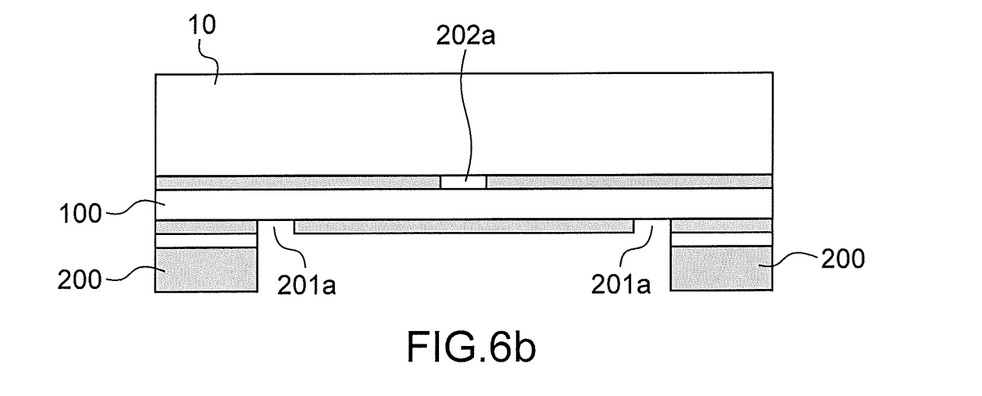

In particular, the first trenches 201a and the second trenches 202a may be laid out such that the deployment of the support layer 100 at step b) corresponds to a homothetic extension along the directions X and Y defined by the matrix layout of the structures 200 (FIGS. 6a and 6b). In this respect, the first paths may comprise first trenches and second trenches parallel to said first paths. In an equivalent manner, the second paths may also comprise first trenches and second trenches parallel to said second paths.

Figure 7A:
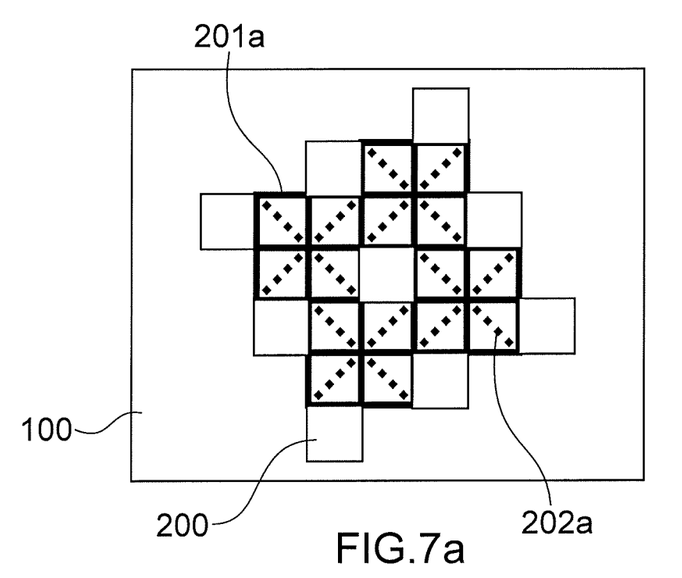
FIGS. 7a and 7b are schematic representations, according to a view of the first face, of the deployed support layer (FIG. 7a) and of the folded support layer (FIG. 7b)
Figure 7B:
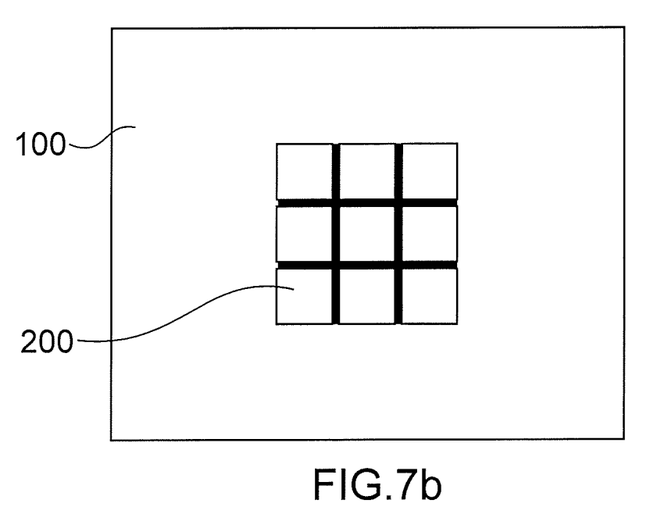
Figure 8A:
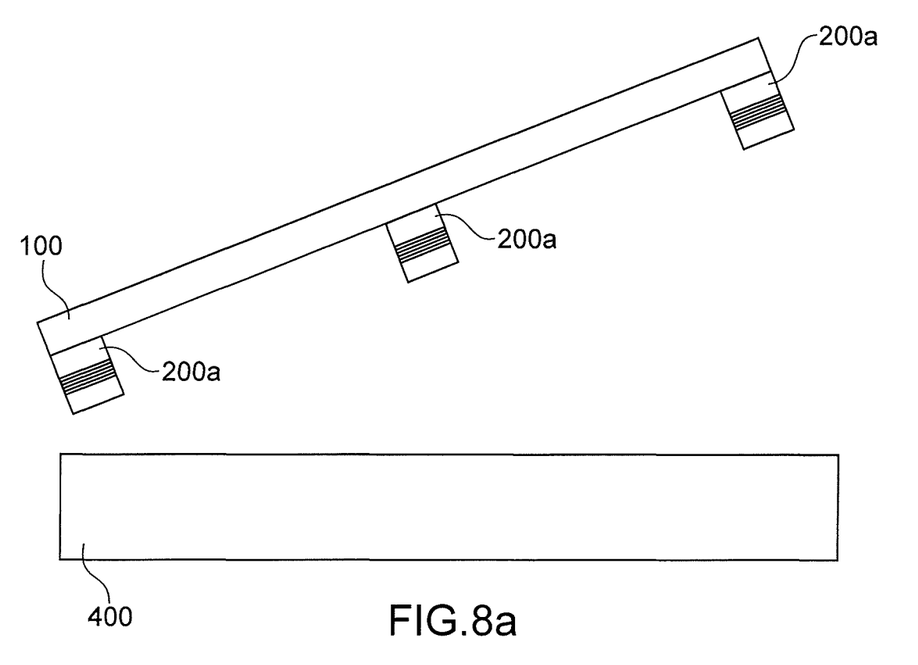
FIGS. 8a to 8f are schematic representations of the different steps of transferring LEDs of different types, notably for the formation of display units.
Figure 8B:
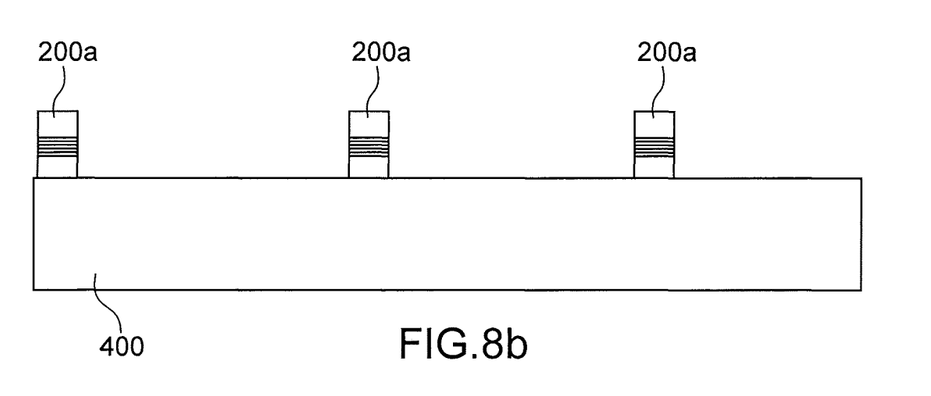
Figure 8C:
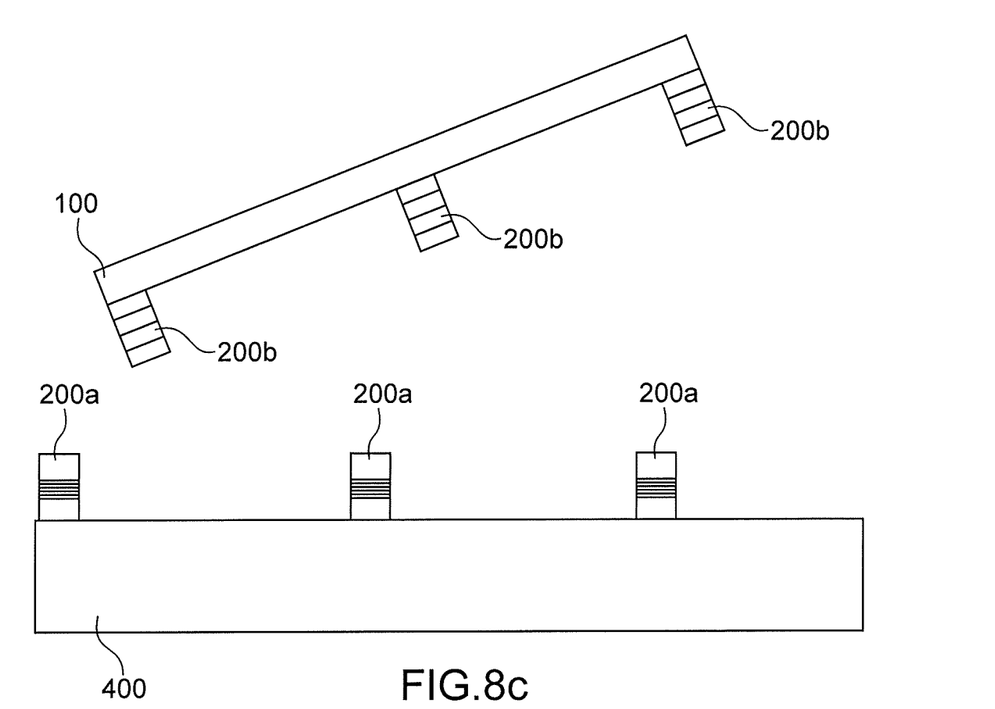
Figure 8D:
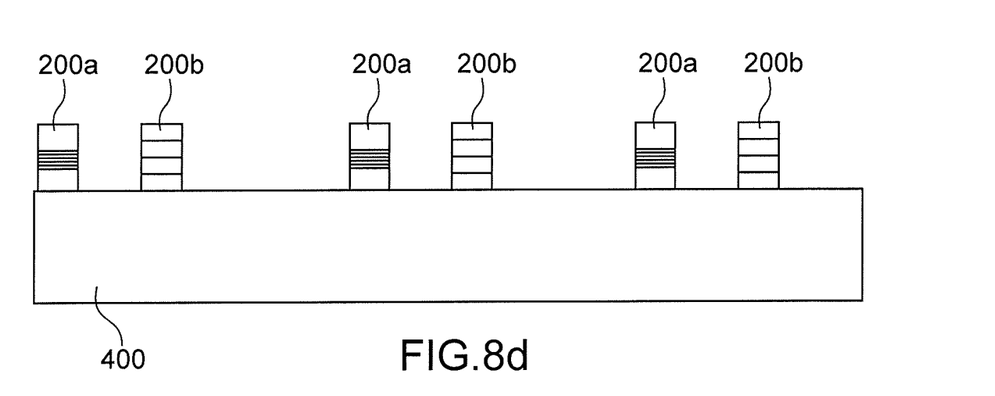
Figure 8E:
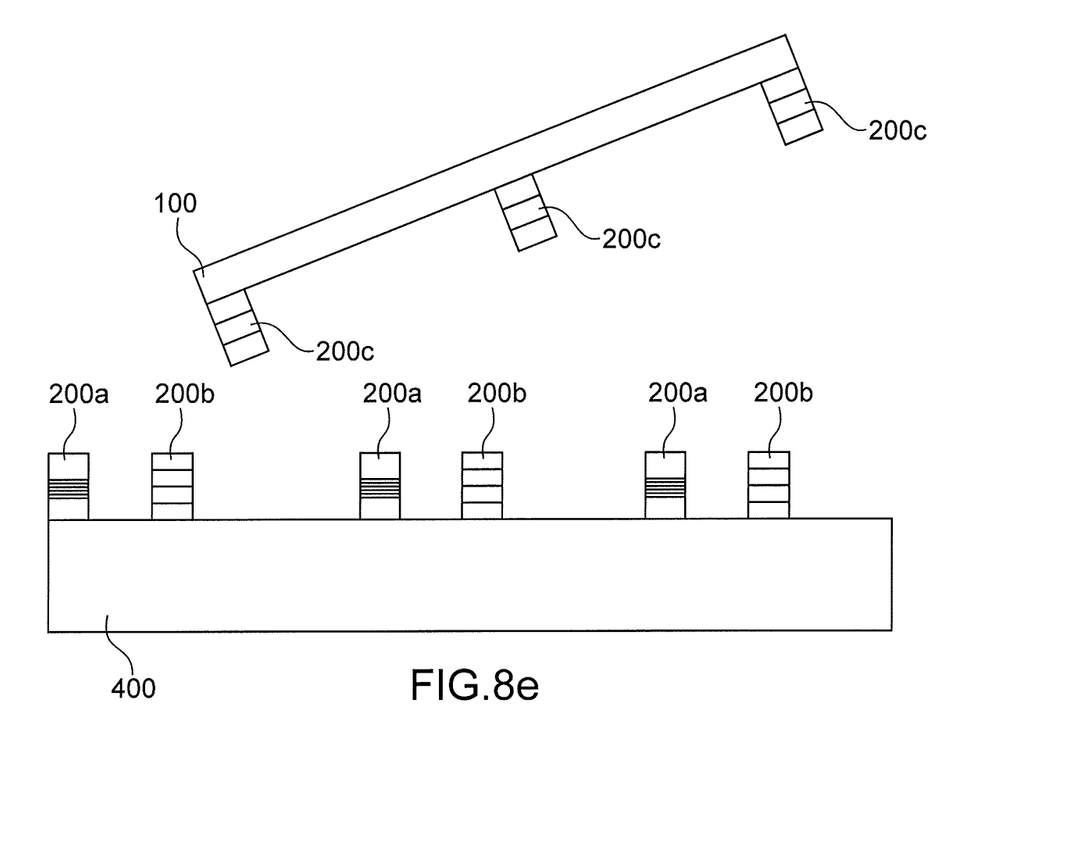
Figure 8F:
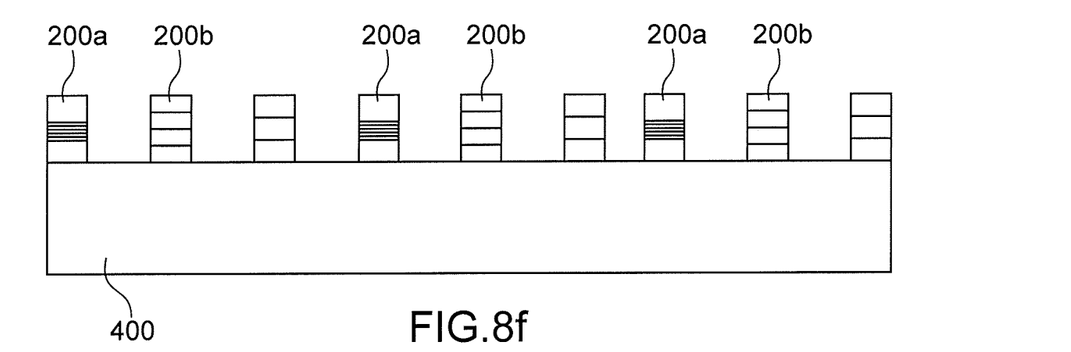

It is also possible to modify the relative layout of the structures 200 with respect to one another for example by laying out the first and second trenches differently. FIGS. 7a and 7b illustrate a layout wherein the first trenches (in solid lines) and the second trenches (in broken lines) each form distinct lattice patterns, and having an angular offset of 45°.

Step b) is followed by a step c) of transferring the plurality of structures onto a host face 410 of a host substrate 400.

Figure 4F:
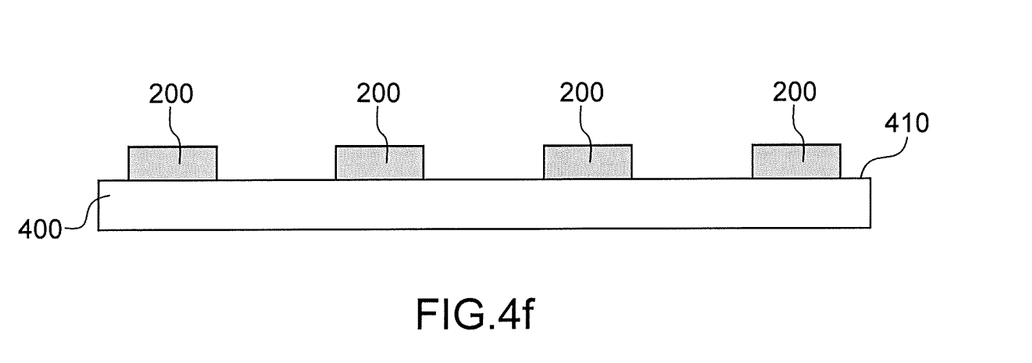

The transfer step c) may comprise the following steps:

1c) an assembly of the structures 200 with the host substrate 400 by placing in contact said structures 200 by their rear face 220 with the host face 410 of the host substrate 400 (FIG. 4e), 2c) a detachment, called second detachment, of the structures 200 from the first face 110 in such a way as to transfer said structures 200 onto the host face 410 (FIG. 4f).

The assembly step 1c) advantageously comprises a bonding by molecular adhesion (or direct bonding).

Furthermore, the adhesion energy between the structures 200 and the host face 410, called host adhesion energy, is advantageously greater than the temporary adhesion energy. For example, the host adhesion energy may be greater than 1 $J/m^2$.

Step 2c) may be executed by weakening the temporary contact interface 111.

This weakening may comprise a force consisting in debonding the support layer 100 from the structures 200. The force may be exerted for example by inserting a blade at the level of the temporary contact interface 111.

Advantageously, the host substrate 400 comprises on its host face 410 sites, called host sites, onto which are transferred the structures 200, the host sites being adapted to favour the adhesion of the structures on said host sites compared to the adhesion of said structure on the first face.

According to this advantageous characteristic, all of the structures remain on the host sites during the detachment from the support layer 100.

The host sites may comprise at least elements selected from: solder balls, micro tubes, metal stacks enabling adhesion of the structures on the host face by eutectic bonding, magnetic materials, or a polymer adhesive.

The structures 200 according to the present invention may comprise any type of cell or stack of films. Notably, the structures 200 may comprise at least one of the typical structures selected from: lenses, reflectors, stack of layers, pads, CMOS components, LEDs, LED and CMOS modules such as described in the application FR 1561421, or conversion layers.

The present invention may advantageously be implemented for the transfer of different types of structures onto a same host substrate.

For example, the invention may be implemented for the transfer of structures 200 of a first type, called first structures 200a, then structures of a second type, called second structures 200b, onto a same host substrate 400 (FIGS. 7a to 7f).

The first structures 200a and the second structures 200b are then transferred onto the host face of the host substrate, respectively, according to a first layout and a second layout.

The first and the second layouts may be identical, and offset along a direction comprised in a plane formed by the host face.

Structures 200 of a third type, called third structures 200c, may also be transferred according to a third layout identical to the first layout and offset from the first and second layouts along a direction comprised in a plane formed by the host face.

In a particularly advantageous manner, the invention may thus be implemented for the formation of display units. Notably, the first, second and third structures comprise, respectively, blue LEDs, green LEDs, and red LEDs (LED is taken to mean light emitting diode).

A blue LED is an LED emitting a luminous radiation in the wavelength range 300 nm-500 nm.

A red LED is an LED emitting a luminous radiation in the wavelength range 600 nm-700 nm.

A green LED is an LED emitting a luminous radiation in the wavelength range 500 nm-600 nm.

REFERENCES

[1] US 2016/111604.
[2] Jun-Hee et al., "Programming Reversibly Self-folding Origami with Micropatterned-Crosslinkable Polymer trilayers", Advanced Materials, 27, 79-85, 2015.
[3] Tomohiro Tachi, "Freeform Origami Tessellations by Generalizing Resch's Patterns", Proceedings of the ASME 2013 International Design Engineering Technical Conference and Computers and Information in Engineering Conference IDETC/CIE 2013.

The invention claimed is:

1. A method for transferring structures onto a host substrate, the method comprising the following successive steps:
   a) supplying a support layer comprising a first face and a second face, structures, each comprising a front face and a rear face, being assembled by their front face on the first face; and
   c) a step of transferring the structures onto a host face of a host substrate,
   wherein:
   the support layer comprises folding regions, between the structures, adapted to pass, in a reversible manner, from a folded state to an unfolded state under the action of an external excitation,
   the method further comprises, between steps a) and c), a step b) of executing the external action in such a way as to make the folding regions pass from one or the other of the folded or unfolded states to the other of the folded or unfolded states such that spacing between relative positions of the structures with respect to each other varies before execution of step c), and
   the support layer further comprises an intermediate layer adapted, under action of the external excitation, to vary its stress state, and thereby generate the passage from one or the other of the folded and unfolded states to the other of these two states, the support layer comprises from its first face to its second face, a first layer, the intermediate layer, and a second layer, the first layer and the second layer, having, respectively, first trenches and second trenches at a level of which are inscribed folds at a level of the folding regions when the support layer is in the folded state.

2. The method according to claim 1, wherein during the passage from the unfolded state to the folded state, a change of stress state of the intermediate layer corresponds to a swelling of said layer such that the first trenches and the second trenches define on the first face, in the folded state, respectively, edge folds and hollow folds.

3. The method according to claim 1, wherein during the passage from the unfolded state to the folded state, a change of stress state of the intermediate layer corresponds to a contraction of said layer such that the first trenches and the second trenches define on the first face, in the folded state, respectively, hollow folds and edge folds.

4. The method according to claim 1, wherein the first layer and the second layer each have a Young's modulus greater than that of the intermediate layer.

5. The method according to claim 1, wherein the first layer and the second layer comprise poly(p-methylstyrene).

6. The method according to claim 1, wherein the external excitation is a variation in pH.

7. The method according to claim 6, wherein the intermediate layer comprises at least one of the elements selected from: poly(4-vinyl pyridine)-polystyrene, poly(2-hydroxyethyl methacrylate)-poly(methacrylic acid), poly(methacrylic acid)-polyethylene glycol, poly(N-isopropylacrylamide-co-acrylic acid)-polyethylene glycol), and gold-poly(methacryl oxyethyl trimethylammonium chloride).

8. The method according to claim 1, wherein the external excitation comprises addition of a solvent.

9. The method according to claim 8, wherein the intermediate layer comprises at least one of the elements selected from: polyvinyl alcohol-chitosan, chitosan polyethylene glycol, polydimethylsiloxane-polyurethane/2-hydroxyethyl methacrylate, and gold-poly(glycidyl methacrylate).

10. The method according to claim 1, wherein the external excitation comprises one of a variation in temperature and a rise in temperature.

11. The method according to claim 10, wherein the intermediate layer comprises at least one of the elements selected from: gold-polydimethylsiloxane, SU8-polycaprolactone resin, poly(N-isopropylacrylamide)-polycaprolactone, polycaprolactone, and poly(caprolactone-co-pentadecadolactone).

12. The method according to claim 1, wherein the external excitation comprises an electric pulse, the intermediate layer comprising polydimethylsiloxane-cardiomyocytes or gold-poly pyrrole.

13. The method according to claim 1, wherein the external excitation comprises implementation of an enzyme.

14. The method according to claim 1, wherein the support layer rests by its second face on a support substrate, an adhesion energy between the second face and the support substrate being adjusted in order to enable the passage from one or the other of the folded and unfolded states to the other of these two states.

15. The method according to claim 14, wherein a relaxation layer is intercalated between the support layer and the support substrate.

16. The method according to claim 1, wherein step a) is preceded by a step of removal a1) of the structures arranged along their rear face on an initial face of an initial substrate.

17. The method according to claim 16, wherein the step of removal a1) successively comprises:
   an assembly of the front face of the structures with the first face of the support layer,
   a first detachment of the structures from the initial substrate.

18. The method according to claim 17, wherein the first detachment requires a first detachment energy adjusted to be less than an adhesion energy between the front face of the structures and the first face.

19. The method according to claim 18, wherein the first detachment energy is less than 0.5 J/m$^2$.

20. The method according to claim 18, wherein the adjustment of the first detachment energy comprises a step of weakening an interface between the initial face and the rear face.

21. The method according to claim 1, wherein step c) successively comprises:
   an assembly of the structures with the host substrate by placing in contact said structures by their rear face with the host face of the host substrate, and
   a second detachment of the structures from the first face in such a way as to transfer said structures onto the host face.

22. The method according to claim 20, wherein an adhesion energy of the structures on the first face is less than an adhesion energy of the structures on the host face.

23. The method according to claim 1, wherein the host substrate comprises, on its host face, host sites onto which are transferred the structures, the host sites being adapted to favour adhesion of the structures on said host sites compared to adhesion of said structures on the first face.

24. The method according to claim 23, wherein the host sites comprise at least one of the elements selected from: solder balls, micro tubes, metal stacks enabling adhesion of the structures on the host face by eutectic bonding, magnetic materials, and a polymer adhesive.

25. A method for transferring structures of a first type, of a second type and of a third type onto a host substrate, the method successively comprising the transfer, according to claim 1, of structures of the first type, of the second type and of the third type onto the host substrate.

26. The method according to claim 25, wherein the structures of the first type, of the second type and of the third type are LEDs each emitting in a different wavelength domain.

* * * * *